(12) United States Patent
Su

(10) Patent No.: US 9,081,036 B2
(45) Date of Patent: Jul. 14, 2015

(54) ADJUSTABLE MEASUREMENT DEVICE

(71) Applicant: HON HAI PRECISION INDUSTRY CO., LTD., New Taipei (TW)

(72) Inventor: Yun-Wen Su, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 168 days.

(21) Appl. No.: 13/949,269

(22) Filed: Jul. 24, 2013

(65) Prior Publication Data

US 2014/0062518 A1 Mar. 6, 2014

(30) Foreign Application Priority Data

Aug. 28, 2012 (TW) ............................... 101131245 A

(51) Int. Cl.
*G01R 1/067* (2006.01)
(52) U.S. Cl.
CPC .................................. *G01R 1/067**77* (2013.01)
(58) Field of Classification Search
CPC ....................................................... G01R 1/067
See application file for complete search history.

(56) References Cited

U.S. PATENT DOCUMENTS

| | | | | |
|---|---|---|---|---|
| 5,612,616 A | * | 3/1997 | Earle | 324/72.5 |
| 7,242,173 B2 | * | 7/2007 | Cavoretto | 324/72.5 |
| 2002/0135349 A1 | * | 9/2002 | Steber et al. | 324/72.5 |
| 2006/0043959 A1 | * | 3/2006 | Cavoretto | 324/72.5 |

* cited by examiner

*Primary Examiner* — Tung X Nguyen
*Assistant Examiner* — Alesa Allgood
(74) *Attorney, Agent, or Firm* — Novak Druce Connolly Bove + Quigg LLP

(57) ABSTRACT

An adjustable measurement device includes a case, a positive contact portion, a negative contact portion, a test probe, a first wire, and a second wire. The positive contact portion is positioned on an end of the case and electrically connected to the first wire. The negative contact portion is movably received in the case and electrically connected to the second wire. A receiving hole is defined in the negative contact portion for the test probe. The test probe includes a main body electrically connected to the negative contact portion, a tip portion electrically connected to the positive contact portion, and an insulating portion positioned between the main body and the tip portion. A distance between the positive contact portion and the negative contact portion is adjustable by moving the negative contact portion. The negative contact portion and the positive contact portion are isolated from each other.

6 Claims, 3 Drawing Sheets

ADJUSTABLE MEASUREMENT DEVICE

BACKGROUND

1. Technical Field

The present disclosure relates to measurements devices, and particularly to an adjustable measurement device.

2. Description of Related Art

In measuring high frequency waveforms or a ripple voltage of electronic components, high voltage active probes and passive probes are available. The high voltage active probes can achieve the shortest path measurement and obtain the real waveform, but the high voltage active probes are expensive and not widely used. The passive probes are inexpensive, but inconvenient in use. For example, when a passive probe is used, a wire must be enlaced on the passive probe, and then a tip of the passive probe and the wire are soldered on a device under test. This is tedious and time consuming. Therefore, there is room for improvement in the art.

BRIEF DESCRIPTION OF THE DRAWINGS

Many aspects of the present disclosure can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the views.

DETAILED DESCRIPTION

The disclosure, including the accompanying drawings, is illustrated by way of examples and not by way of limitation. It should be noted that references to "an" or "one" embodiment in this disclosure are not necessarily to the same embodiment, and such references can mean "at least one."

Figure 1:
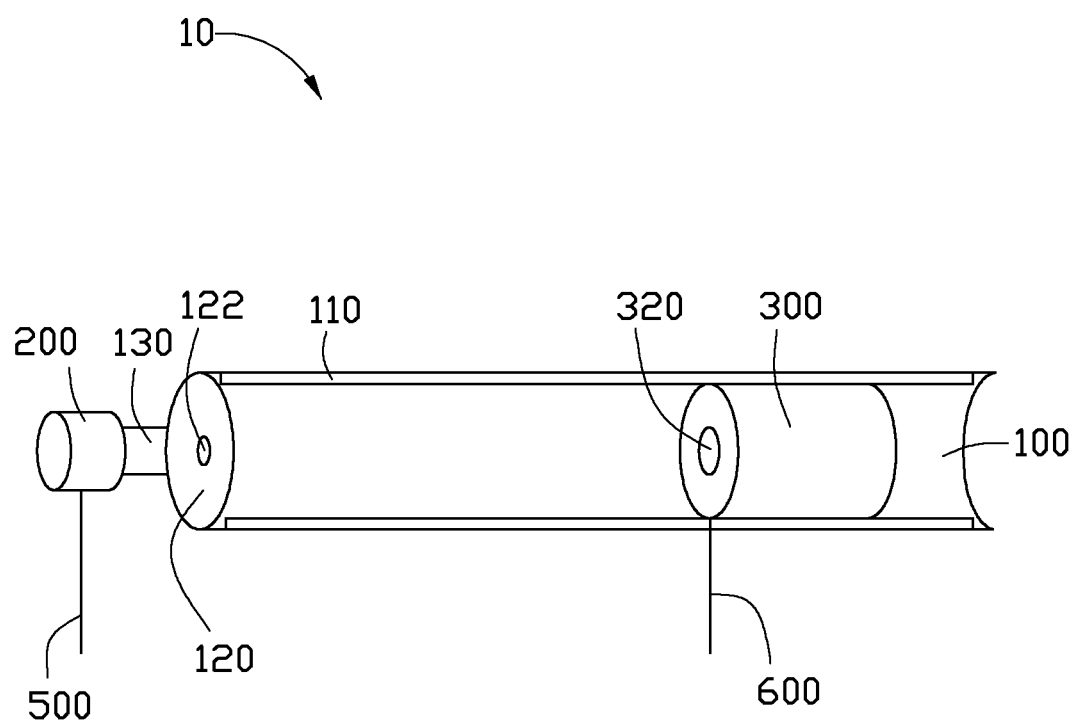
FIG. 1 is an isometric view of an adjustable measurement device in accordance with a first embodiment of the present disclosure.
Figure 2:
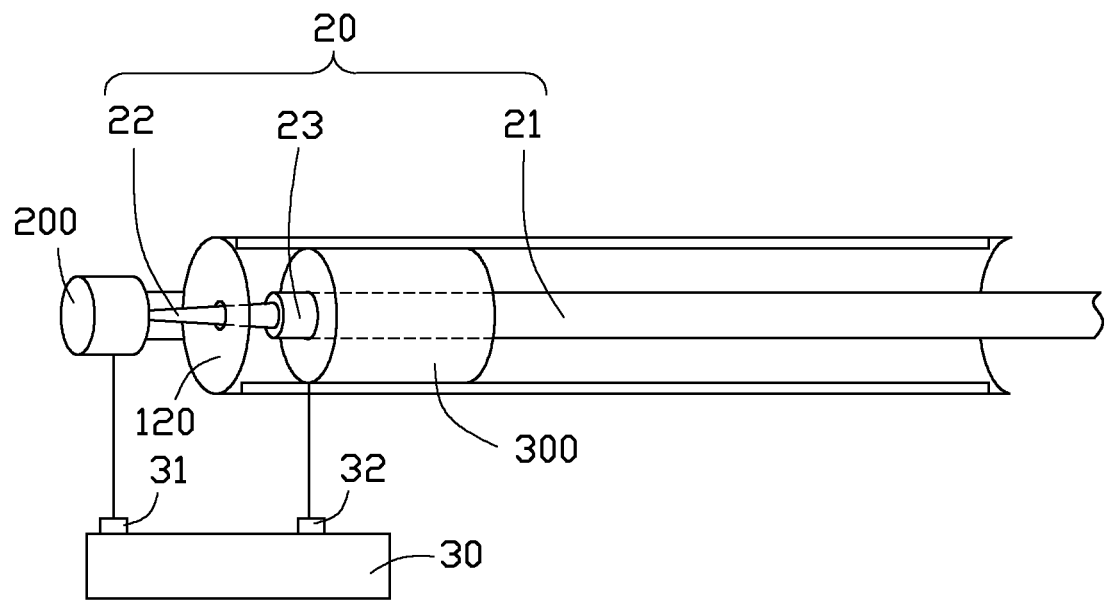
FIG. 2 is an assembled view of the adjustable measurement device of FIG. 1 in use.

FIGS. 1 and 2 show a first embodiment of an adjustable measurement device 10. The adjustable measurement device 10 includes a case 100, a positive contact portion 200, a negative contact portion 300, and two wires 500 and 600.

In the embodiment, the case 100 is pipe-like and has a C-shape cross-section. A guide rail 110 is positioned on an inner surface of the case 100 and extends longitudinally in the case 100. A circular stop portion 120 extends from a first end of the case 100 and surrounds an axis of the case 100. A through hole 122 is defined in the stop portion 120, aligning with the axis of the case 100. A bracket 130 extends from the first end of the case 100 along the longitudinal direction of the case 100. Each of the case 100, the guide rail 110, the stop portion 120, and the bracket 130 are made of insulating materials, such as plastic. A length of the guide rail 110 is approximately equal to a length of the case 100.

The positive contact portion 200 is positioned on the bracket 130 and electrically connected to the wire 500. The negative contact portion 300 is received in the case 100 and assembled on the guide rail 100. The negative contact portion 300 is electrically connected to the wire 600. A receiving hole 320 is defined in the negative contact portion 300. A length of the negative contact portion 300 is less than the length of the case 100, such that the negative contact portion 300 can slide longitudinally in the case 100 on the guide rail 110. A distance between the positive contact portion 200 and the negative contact portion 300 is adjustable by sliding the negative contact portion 300.

A test probe 20 of a testing device, such as an oscilloscope (not shown), may be inserted into the case 100 from a second end of the case 100 opposite to the first end of the case 100. The test probe 20 includes a main body 21, a tip portion 22, and an insulation portion 23 positioned between the main body 21 and the tip portion 22, to insulate the main body 21 from the tip portion 22. Each of the main body 21 and the tip portion 22 are made of conductive materials. The main body 21 is electrically connected to a positive signal receiving terminal of the testing device. The tip portion 22 is electrically connected to a negative signal receiving terminal of the testing device. The main body 21 and the insulation portion 23 are cylindrical and have the same radius. The tip portion 22 is tapered, tapering from the insulation portion 23 towards a distal end of the tip portion 22.

In the embodiment, a radius of the receiving hole 320 is substantially equal to or slightly greater than the radius of the main body 21, to enable the main body 21 to extend through the receiving hole 320 and electrically connect to the negative contact portion 300. A radius of the through hole 122 is greater than the greatest radius of the tapered tip portion 22, to enable the tip portion 22 to extend through the receiving hole 320 and electrically connect to the positive contact portion 200. The radius of the through hole 122 is less than a radius of the negative contact portion 300, to ensure that the negative contact portion 300 does not disengage from the case 10 and that no electrical contact is made with the positive contact portion 200.

When the adjustable measurement device 10 is used together with the testing device to obtain test signals from two test points 31 and 32 of a device under test (DUT) 30, a distance between the positive contact portion 200 and the negative contact portion 300 is adjusted to be approximately equal to a distance between the test points 31 and 32, by sliding the negative contact portion 300 as necessary. The wire 500 is soldered on the test point 31, such that the positive contact portion 200 is electrically connected to the test point 31 through the wire 500. The wire 600 is soldered on the test point 32, such that the negative contact portion 300 is electrically connected to the test point 32 through the wire 600. The test probe 20 of the test device is inserted into the case 100 from the second end of the case 100. The tip portion 22 extends through the receiving hole 320 and then through the through hole 122, and is electrically connected to the positive contact portion 200. The main body 21 extends through the receiving hole 320, and is electrically connected to the negative contact portion 300. The signal outputted from the test point 31 is transmitted to the testing device through the wire 500, the positive contact portion 200, and the tip portion 22 in that order. The test signal outputted from the test point 32 is transmitted to the test device through the wire 600, the negative contact portion 300, and the main body 21 in that order.

In the embodiment, the main body 21 is insulated from the tip portion 22 by the insulation portion 23, and the stop portion 120 prevents the negative contact portion 300 from disengaging from the case 100. Therefore, the negative contact portion 300 will not be electrically connected to the positive contact portion 200.

Figure 3:
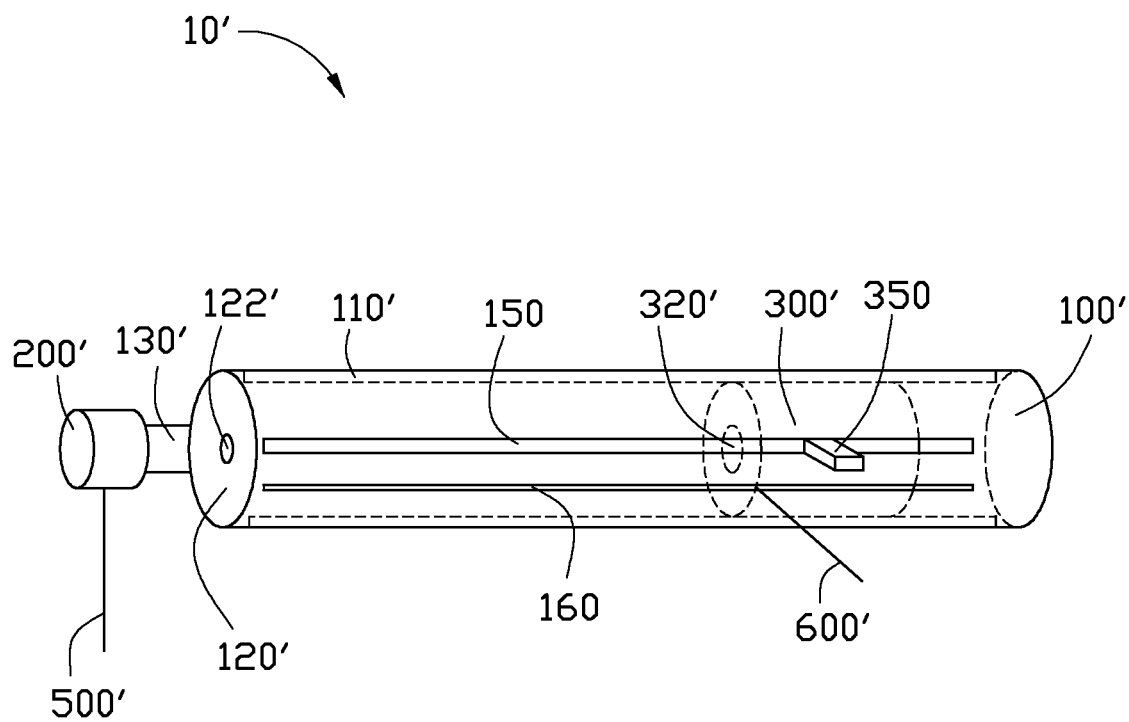
FIG. 3 is an isometric view of an adjustable measurement device in accordance with a second embodiment of the present disclosure.

FIG. 3 shows a second embodiment of an adjustable measurement device 10'. The adjustable measurement device 10' includes a case 100', a positive contact portion 200', a negative contact portion 300', and two wires 500' and 600'.

In the embodiment, the case 100' is a round pipe. A guide rail 110' is positioned on an inner surface of the case 100' and extends longitudinally from the case 100'. A circular stop portion 120' extends from a first end of the case 100' and surrounds an axis of the case 100'. A through hole 122' is defined in the stop portion 120', aligning with the axis of the case 100'. A bracket 130' extends from the first end of the case 100' along the longitudinal direction of the case 100'. Two slots 150 and 160 are defined in a sidewall of the case 100' along the longitudinal direction of the case 100'. Each of the case 100', the guide rail 110', the stop portion 120', and the bracket 130' are made of insulating material, such as plastic. A length of each of the guide rail 110' and the slots 150, 160 is approximately equal to a length of the case 100'.

The positive contact portion 200' is positioned on the bracket 130' and electrically connected to the wire 500'. The negative contact portion 300' is received in the case 100' and assembled on the guide rail 100'. A receiving hole 320' is defined in the negative contact portion 300'. A bar-shaped handle 350 is positioned on a sidewall of the negative contact portion 300', and protrudes out of the case 100' through the slot 150. The wire 600' is electrically connected to the negative contact portion 300' through the slot 160. A length of the negative contact portion 300 is less than the length of the case 100'. The negative contact portion 300' can slide longitudinally within the case 100' on the guide rail 110' by moving the handle 350 in the slot 150. A distance between the positive contact portion 200' and the negative contact portion 300' may be adjusted by sliding the negative contact portion 300'.

A process of the adjustable measurement device 10' being used together with the testing device to obtain test signals from the test points 31 and 32 of the DUT 30 is similar to the usage of the adjustable measurement device 10 and is not repeated. In other embodiments, the stop portion 120 (120') may be omitted, and the bracket 130 (130') may be extended, to form a distance between the positive contact portion 200 (200') and the first end of the case 100 (100'), and to prevent electrical contact between the negative contact portion 300 (300') and the positive contact portion 200 (200').

Even though numerous characteristics and advantages of the disclosure have been set forth in the foregoing description, together with details of the structure and function of the disclosure, the disclosure is illustrative only, and changes may be made in detail, especially in the matters of shape, size, and arrangement of parts within the principles of the disclosure to the full extent indicated by the broad general meaning of the terms in which the appended claims are expressed.

What is claimed is:

1. An adjustable measurement device comprising:
   a case comprising an end;
   a positive contact portion positioned at the end of the case;
   a negative contact portion movably received in the case, and defining a receiving hole;
   a test probe extending through the receiving hole of the negative contact portion, and comprising:
      a main body electrically connected to the negative contact portion;
      a tip portion electrically connected to the positive contact portion; and
      an insulation portion positioned between the main body and the tip portion, to insulate the main body from the tip portion;
   a first wire electrically connected to the positive contact portion; and
   a second wire electrically connected to the negative contact portion;
   wherein a distance between the positive contact portion and the negative contact portion is adjustable by moving the negative contact portion in the case, and the positive contact portion is isolated from the positive contact portion.

2. The adjustable measurement device of claim 1, wherein the case is pipe-like and has a C-shaped cross-section, a circular stop portion extends from the end of the case and surrounds an axis of the case, a through hole is defined in the stop portion and aligns with the axis of the case, a bracket extends from the end of the case along the longitudinal direction of the case, the positive contact portion is positioned on the bracket, and the tip portion extends through the receiving hole and through the through hole, and is electrically connected to the positive contact portion.

3. The adjustable measurement device of claim 1, wherein the case is a round pipe, a first slot and a second slot are defined in a sidewall of the case along the longitudinal direction of the case, a handle is positioned on a sidewall of the negative contact portion and protrudes out of the case through the first slot, the second wire is electrically connected to the negative contact portion through the second slot, and the negative contact portion may be moved in the case by operating the handle.

4. The adjustable measurement device of claim 1, wherein the case comprises a bracket extending from the end of the case along the longitudinal direction of the case, the positive contact portion is positioned on the bracket, and there is a distance between the positive contact portion and the end of the case, to prevent electrical contact between the negative contact portion and the positive contact portion.

5. The adjustable measurement device of claim 1, wherein the case is made of insulating material.

6. The adjustable measurement device of claim 1, wherein the case comprises a guide rail positioned on an inner surface of the case and extending longitudinally in the case, the negative contact portion is received in the case and assembled on the guide rail, the negative contact portion can slide longitudinally in the case on the guide rail.

* * * * *